(12) United States Patent
Mills, Jr.

(10) Patent No.: US 6,458,676 B1
(45) Date of Patent: Oct. 1, 2002

(54) METHOD OF VARYING THE RESISTANCE ALONG A CONDUCTIVE LAYER

(75) Inventor: Allen Paine Mills, Jr., Chatham, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/888,879

(22) Filed: Jun. 25, 2001

(51) Int. Cl.⁷ .............................................. H01L 21/20
(52) U.S. Cl. ...................................... 438/584; 438/788
(58) Field of Search ................................ 438/584, 597, 438/643, 663, 758, 381, 770, 771, 773, 774, 788, 795

(56) References Cited

U.S. PATENT DOCUMENTS

| | | | |
|---|---|---|---|
| 3,813,766 A | * 6/1974 | Brock et al. | 29/603 |
| 4,045,310 A | 8/1977 | Jones et al. | 204/129 |
| 4,757,359 A | 7/1988 | Chiao et al. | 357/23 |
| 4,879,587 A | 11/1989 | Jerman et al. | 357/55 |
| 5,120,679 A | 6/1992 | Boardman et al. | 439/195 |
| 5,391,518 A | 2/1995 | Bhushan | 437/190 |
| 5,394,356 A | 2/1995 | Yang | 365/177 |
| 5,429,975 A | 7/1995 | Sheu et al. | 437/52 |
| 5,466,963 A | 11/1995 | Beasom | 257/516 |
| 5,474,948 A | 12/1995 | Yamazaki | 437/60 |
| 5,696,385 A | 12/1997 | Song et al. | 257/10 |
| 5,847,442 A | * 12/1998 | Mills et al. | 257/536 |
| 5,859,458 A | 1/1999 | Hsuch | 257/347 |
| 5,899,707 A | 5/1999 | Sanchez et al. | 438/131 |
| 6,107,666 A | * 8/2000 | Chang | 257/391 |
| 6,185,121 B1 | 2/2001 | O'Neill et al. | 365/94 |
| 6,291,568 B1 | * 9/2001 | Lussey | 524/413 |
| 6,297,484 B1 | * 10/2001 | Usui et al. | 219/631 |

OTHER PUBLICATIONS

U.S. patent application Ser. No. 09/095,231, Bevk et al., filed Jan. 10, 1998.

U.S. patent application Ser. No. 09/479,708, Mills et al., filed Jan. 7, 2000.

* cited by examiner

*Primary Examiner*—David Nelms
*Assistant Examiner*—David Nhu
(74) *Attorney, Agent, or Firm*—Ozer M. N. Teitelbaum

(57) ABSTRACT

A method for varying the resistance along a conductive layer. The method including the step of removing at least a portion of a resistance-altering constituent diffused within the conductive layer.

18 Claims, 4 Drawing Sheets

METHOD OF VARYING THE RESISTANCE ALONG A CONDUCTIVE LAYER

CROSS-REFERENCE TO RELATED APPLICATIONS

Related subject matter is disclosed in my co-pending, U.S. patent application Ser. No. 09/095,231, filed on Jun. 10, 1998, Ser. No. 09/479,708, filed on Jan. 7, 2000, as well as Ser. No. 09/888,878 filed concurrently with the present application on Jun. 25, 2001.

BACKGROUND OF THE INVENTION

1. Field of the Invention

The present invention relates to semiconductors.

2. Description of Related Art

A read only memory ("ROM") is a device having a plurality of memory cells that permanently store bits of data. A resistive ROM typically includes a planar array of parallel word lines, which is perpendicular to and insulated from a planar array of parallel bit lines. A designated number of the memory cells in the ROM have a resistive element connecting a node of one word line with a node of one bit line. The presence or absence of a resistive element in each memory cell determines whether a binary "0" or "1," for example, is stored therein. The values stored within the ROM are "read" (i.e., output) by measuring a sense current flowing through each bit line from the memory cells of successive word lines.

Various ROM structures are known in the art. One known structure, referred to as a mask-written ROM, employs a semiconductor lithographic mask to "write" (i.e., program) the values of the data bits into the memory cells of the ROM. The mask comprises a pattern for designating each memory cell in which the resistive element is to be fabricated.

With the desired storage capacity (i.e., the number of stored bits per device) of ROMs ever increasing, it follows that the number of cells needed has also been increasing. However, as the number of memory cells increase, the problem of crosstalk has grown. Crosstalk may be characterized as the misinterpretation of a bit attributed to the influence of other bits stored in the ROM. Crosstalk results from the influence of the inevitable wire resistance in each bit line. As the number of cells increase, the wire resistance of each bit line increases relative to the resistance of each memory cell. Consequently, an increase in the wire resistance of each bit line increases the likelihood that a substantial portion of the sense current on one word line will be redirected onto an adjacent word line. This may cause the false reading of the binary values stored within each cell of the ROM.

One known approach for minimizing crosstalk has been to incorporate a supplemental resistance—e.g., a field effect transistor—in each memory cell of the ROM. The effective resistance of each cell may therefore be sufficiently increased relative to the wire resistance to reduce the likelihood that substantial amounts of sense current on one word line will be redirected onto an adjacent word line.

As industry drives towards increasing the density (i.e., the number of bits per unit area) of ROMs, however, the use of a field effect transistor as a supplemental resistance has become a problem. Field effect transistors require considerable unit area relative to each ROM cell. Consequently, an alternate ROM structure is needed having a sufficiently high relative memory cell resistance to minimize crosstalk and increase ROM density.

In accordance with my co-pending, commonly assigned, U.S. patent application, entitled "READ ONLY MEMORY STRUCTURE," Ser. No. 08/748,035, filed concurrently with the present application, I have invented a ROM structure that engenders maximum density. As detailed in my co-pending application, a resistance-altering constituent is disposed within at least one designated memory cell of a plurality of memory cells such that a first numerical value may be interpreted as being stored in each designated cell and at least a second numerical value may be interpreted as stored in each remaining (non-designated) cell of the plurality. In one example disclosed in my co-pending patent application, each memory cell of the plurality is formed from a conductive layer, such as polycrystalline silicon, while a Group IA element, such as hydrogen, is disposed within the conductive layer of each designated memory cell.

As detailed in my co-pending patent application, each designated memory cell has a first resistance, while each remaining memory cell has at least a second resistance. Advantageously, I have recognized that disposing the resistance-altering constituent within each designated memory cell sufficiently increases the information storage capability over presently available ROM structures.

I have also identified a number of issues in making the ROM structure detailed in my aforementioned co-pending patent application. More particularly, I have recognized that employing a lithographic mask to write the binary values into the memory cells of a ROM, for example, is cost prohibitive. Each new data set to be stored in a ROM requires the production of a new lithographic mask. Furthermore, the use of a lithographic mask to dispose the resistance-altering constituent necessitates the completion of each ROM exclusively at the manufacturer's site.

SUMMARY OF THE INVENTION

I have invented a method for varying the resistance along a conductive layer. More particularly, I have invented a method for making a ROM structure, without the need for a lithographic mask. In my invention, a resistance-altering constituent is diffused into a conductive layer, and thereafter, at least a portion of the in-diffused resistance-altering constituent is moved according to a pattern. The pattern of moving the resistance-altering constituent may relate, advantageously, to the binary values of the data bits to be stored in a ROM. In one example of the invention, each memory cell of a ROM is formed from a conductive layer, such as polycrystalline silicon, while the resistance-altering constituent comprises at least one Group IA element, such as hydrogen.

I have recognized that by eliminating the need for a lithographic mask to write the binary values into the memory cells of a ROM, for example, the cost of manufacture will be reduced. Moreover, by moving at least a portion of the resistance-altering constituent from the conductive layer, my method enables a ROM to be written remotely (e.g., in the field), in contradistinction with the prior art, which requires the ROM be written at the manufacturer's site.

BRIEF DESCRIPTION OF THE DRAWINGS

The present invention will be better understood from reading the following description of non-limiting embodiments, with reference to the attached drawings, wherein below.

DETAILED DESCRIPTION OF THE PRESENT INVENTION

Figure 1:
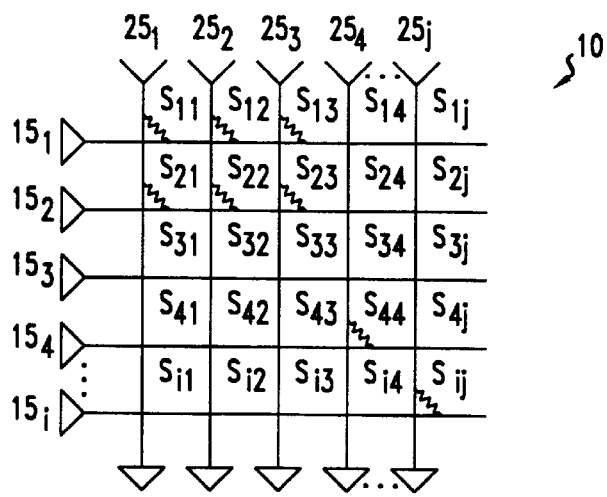
FIG. 1 is a top view of a first known read only memory structure.

Referring to FIG. 1, a known read only memory ("ROM") structure 10 is illustrated. ROM 10 includes a plurality of cells, $S_{11}$ through $S_{ij}$, for permanently storing bits of data. ROM 10 comprises a planar array of parallel word lines, $15_1$ through $15_i$, which is perpendicular to and insulated from a planar array of parallel bit lines, $25_1$ through $25_j$. To store bits of data, a number of designated memory cells in ROM 10 have a resistive element, R, for connecting a node of one word line with a node of one bit line. The presence or absence of a resistive element, R, in each cell determines whether a binary data bit (i.e., "0" or "1") is stored therein.

ROM structure 10, however, is limited in its ability to store a large number of data bits. As the storage capacity (i.e., the number of cells) of structures such as ROM 10 is increased, the wire resistance, $r_w$, of each bit line increases relative to the values that are practically available using present manufacturing technique for resistive element, R. The wire resistance, $r_w$, of each bit line is determined by the resistivity, $\rho$, of the material employed and geometry of the line itself. In typical practice, the binary values stored within the ROM are read by measuring a sense current flowing through each bit line from the cells of successive word lines. As a result, the likelihood that a substantial portion of the sense current will be unintentionally redirected onto an adjacent word line increases with a relative increase in the resistance of each bit line. This unintentional redirection of the sense current may cause the false reading of the binary values stored within the ROM, commonly referred to as crosstalk.

Figure 2:
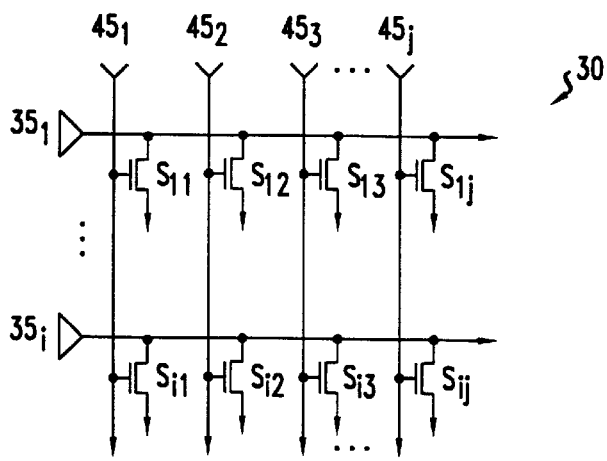
FIG. 2 is a top view of a second known read only memory structure.

Another ROM structure is shown in FIG. 2. Here, a ROM structure 30 is illustrated comprising a planar array of parallel word lines, $35_1$ through $35_i$, which is perpendicular to and insulated from a planar array of parallel bit lines, $45_1$ through $45_j$. To minimize crosstalk, ROM structure 30 incorporates a field effect transistor within each cell, $S_{11}$ through $S_{ij}$. The addition of the field effect transistor sufficiently increases the effective resistance of each cell relative to the wire resistance, $r_w$, of each of the bit lines, $45\textit{1}$ through $45j$, that the likelihood that a portion of the sense current will be unintentionally redirected onto an adjacent word line is substantially minimized.

While minimizing crosstalk, ROM structure 30 has shortcomings. More particularly, since each cell employs a field effect transistor, the ability to increase the density (i.e., the number of bits per unit area) of ROM structure 30 is limited. Field effect transistors require considerable unit area relative to each ROM cell. Consequently, an alternate cell structure is needed that provides a sufficiently high resistance for minimizing crosstalk, while also reducing the unit area of each cell to increase the potential density of the ROM structure.

Several considerations influence the density of a ROM structure. These include the size of the smallest lithographic feature size, $\lambda$, the size of the resistive elements interconnecting word lines with bit lines, as well as the actual unit area, A, of the memory circuit portion of the ROM. If each memory cell comprises a field effect transistor, such as in ROM structure 30, the minimum unit area, A, occupied by each cell has been shown to be $16*(\lambda)^2$. In contrast, the minimum unit area, A, of each memory cell employing a resistive element, such as R in ROM structure 10, is proven to be $4*(\lambda)^2$, or about 25% of ROM structure 30. For more information on unit area as it pertains to memories, see C. A. David and B. Feldman, "High-Speed Fixed Memories Using Large Scale Integrated Resistor Memories," *IEEE Trans. On Computers*, C-17 (1968), pp. 721–728, B. Prince, "Semiconductor Memories, A Handbook of Design, Manufacture and Application," $2^{nd}$ Edition, John Wiley & Sons (1991), for example.

To realize the density of the ROM structure 10 along with the ability to minimize crosstalk as in ROM structure 30, I have invented a new ROM structure. My ROM structure has a resistance-altering constituent disposed within a number of designated memory cells such that a first binary value is stored in each designated cell and a second binary value is stored in each remaining (non-designated) memory cell. The designated memory cells are selected in accordance with the pattern of binary values (e.g., "0"s and "1"s) of the data bits stored in the ROM.

In my invention, each designated cell has a first resistance by disposing the resistance-altering constituent therein, while the remaining (non-designated) memory cells of the plurality each have at least a second resistance. Consequently, a first binary value may be recognized as being stored in each designated cell, and at least a second binary value may be recognized as being stored in each of the remaining cells. In realizing this ROM structure, I have recognized that the resistance-altering constituent, when present within each designated cell, provides a sufficiently high resistance, relative to the wire resistance of the bit lines, to minimize the potential for crosstalk. Similarly, in the absence of the resistance-altering constituent, each of the cells also has a sufficient resistance, relative to the wire resistance of the bit lines, to minimize the potential for crosstalk.

Figure 3:
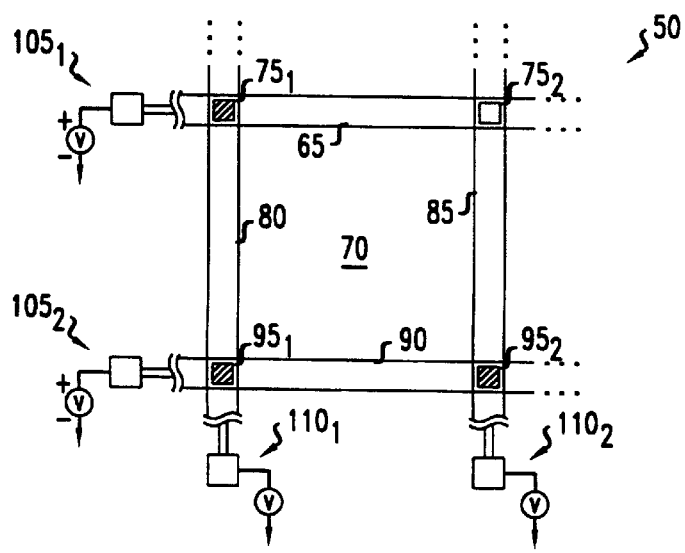
FIG. 3 is a top view of an embodiment of my co-pending application.

Referring to FIG. 3, a top view of an embodiment of the present invention is illustrated. Here, a ROM structure 50 is shown having a plurality of memory cells, $75_1$, $75_2$, $95_1$ and $95_2$. ROM structure 50 includes a planar array of word lines, which is perpendicular to the planar array of parallel bit lines. The planar array of word lines—including a first and a second word line, 65 and 90—is insulated from the planar array of bit lines by a dielectric layer 70—including a first and a second bit line 80 and 85.

Each memory cell of ROM structure 50 permanently stores a written bit of data. The bits of data are written by disposing a resistance-altering constituent within designated memory cells of ROM structure 50. Consequently, the presence or absence of the resistance-altering constituent within each memory cell determines whether a first or a second binary value is stored therein.

Each memory cell, $75_1$, $75_2$, $95_1$ and $95_2$, comprises a conductive material. The resistance of each designated memory cell may be modified by disposing the resistance-altering constituent within the conductive material. The resistance-altering constituent may be realized by various materials which modify (i.e., decrease or increase) the resistance of the conductive component within each designated cell. One important consideration in choosing the resistance-altering constituent is the resistance of the designated and the non-designated cells relative to the wire resistance, $r_w$, of each bit line.

In one example of the present invention, the conductive material in each cell of ROM structure 50 comprises polycrystalline silicon. The resistance-altering constituent comprises at least one Group IA element, such as hydrogen, for example. Group IA elements lower the resistance of polycrystalline silicon when disposed therein. Consequently, each designated memory cell of ROM structure 50 comprises polycrystalline silicon having at least one Group IA element disposed therein, while the remaining memory cells comprise polycrystalline silicon alone. Exemplary values for ROM structure 50 include a resistance of about 100 MΩ for each designated memory cell, and a resistance of about ten (10) GΩ for each non-designated memory cell.

Structurally, each memory cell of ROM 50 electrically couples a node on a word line with a node on a bit line. More particularly, memory cell $75_1$ couples first word line 65 with first bit line 80, while memory cell $75_2$ couples first word line 65 with second bit line 85. Likewise, memory cell $95_1$ couples second word line 90 with first bit line 80, while memory cell $95_2$ couples second word line 90 with first bit line 85.

By the arrangement of ROM structure 50, the binary values of the bits stored within the memory cells are "read" (i.e., output) by measuring a sense current flowing through each bit line from the memory cells of successive word lines. Initially, a "read" voltage—typically about 5V or less—is applied to first word line 65 from a first DC voltage source $105_1$. The application of a "read" voltage causes a sense current (i.e., data) to flow through the resistance of each cell to a corresponding bit line. As shown, the resistance-altering constituent is disposed within memory cell $75_1$, and not disposed within memory cell $75_2$. The resistance of memory cell $75_1$, as such, will be lower than that of memory cell $75_2$. Consequently, the sense current flowing though bit line 80 from memory cell $75_1$ will be higher than the sense current flowing though bit line 85 from memory cell $75_2$.

To determine the bit values of the data stored within the entire ROM structure 50, a read voltage is applied to successive word lines. As such, a "read" voltage is applied to second word line 90 from a DC voltage source $105_2$, after a similar "read" voltage is applied to first word line 65. Memory cells $95_1$ and $95_2$, as shown, both have the resistance-altering constituent disposed therein. Consequently, the sense current flowing though bit line 80 from memory cell $95_1$ will be about the same as the sense current flowing though bit line 85 from memory cell $95_2$.

Once the sense current is generated for each cell on a particular word line, the binary values may be determined by various means known to skilled artisans. For example, the sense currents flowing as a result of the resistance values in memory cells, $75_1$ and $75_2$, are measured by coupling a current sensor with each bit line. As shown, each bit line, 80 and 85, is electrically coupled with a current sensor, $110_1$ and $110_2$, to measure the sense current flowing through each bit line, as successive word lines are "read." In a binary-based design, each current sensor, $110_1$ and $110_2$, measures the sense current and determines whether it falls within a first or a second predetermined current range. By this arrangement, the first predetermined current range is associated with a first binary value, while the second predetermined current range is associated with a second binary value. Once the predetermined current range is determined, each current sensor generates the associated binary value.

Figure 4A:
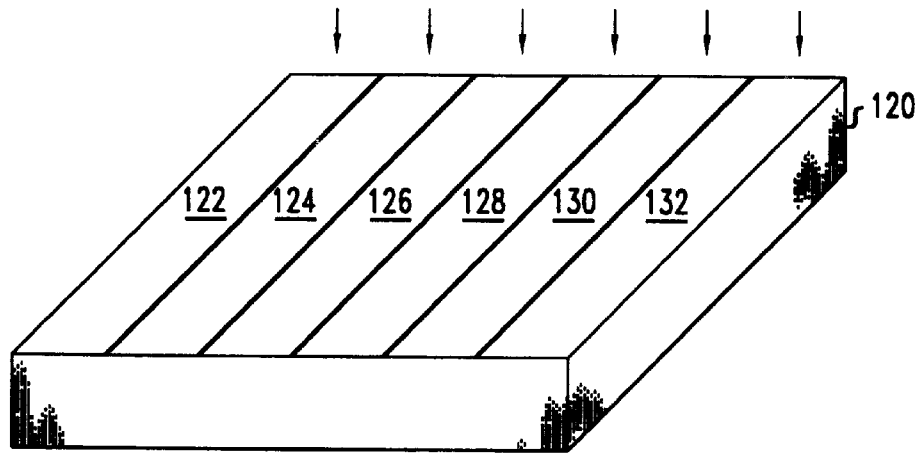
FIGS. 4(a) through 4(c) are perspective views of an embodiment of the present invention.
Figure 4B:
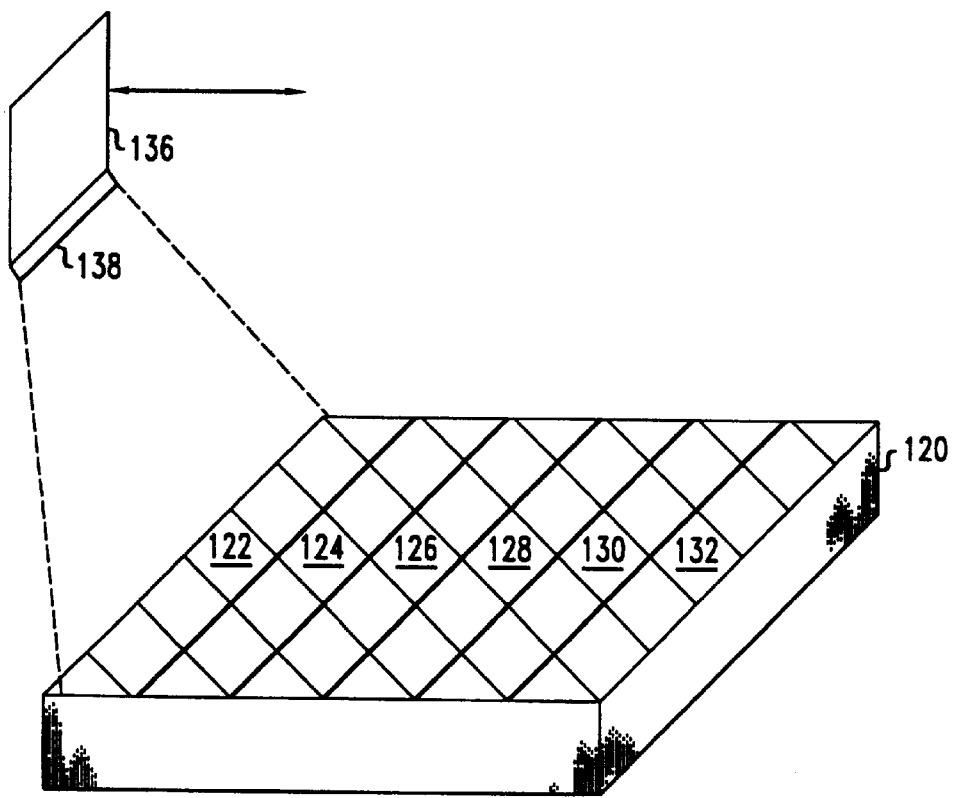
Figure 4C:
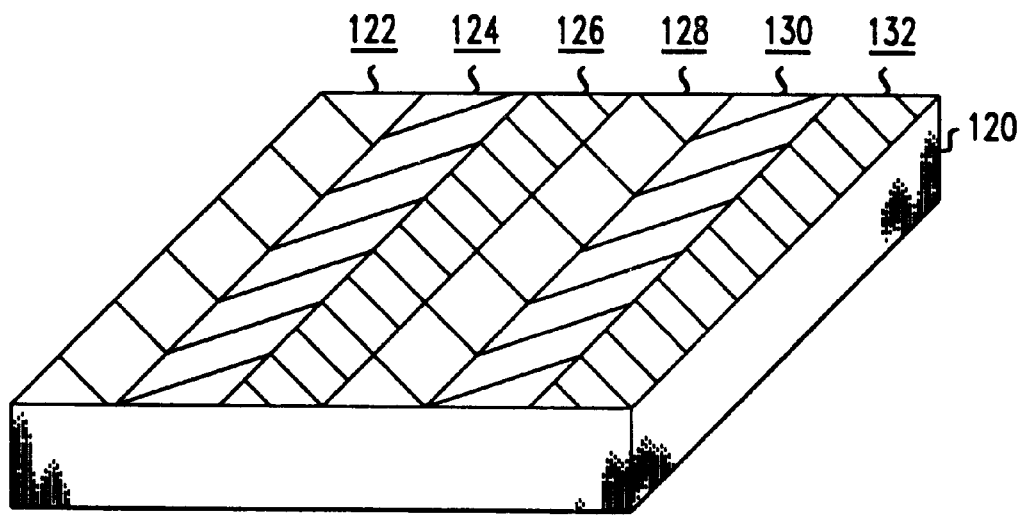

Referring to FIGS. 4(a) through 4(c), a perspective view of a method of achieving a varying resistance along a conductive layer is shown. More particularly, this method enables the selective formation of a predetermined number of resistance values. Consequently, the present method may be employed to create a first and a second resistance for use in a binary-based device, such as memory cells $75_1$, $75_2$, $95_1$ and $95_2$ in ROM structure 50 of FIG. 3, pursuant to my co-pending, commonly assigned, U.S. patent application, entitled "READ ONLY MEMORY STRUCTURE," Ser. No. 09/888,878, filed concurrently with the present application. Numerous other applications of this method, however, will be apparent to skilled artisans upon reviewing the instant disclosure.

Referring to FIG. 4(a), a perspective view is illustrated of a first process step according to the present method. Here, a resistance-altering constituent is diffused into a conductive layer 120. Conductive layer 120 comprises a number of segments, 122 through 132. Each segment, 122 through 132, represents an individual portion (having any shape and/or dimension) of conductive layer 120, and, as such, may be independently processed according to the present method. The step of in-diffusion is performed on each segment, 122 through 132, such that similar atomic concentrations of the resistance-altering constituent are disposed within each segment of conductive layer 120.

The step of in-diffusion may be realized by various known techniques. One such method involves ion implantation, though substitutes for disposing the resistance-altering constituent within each segment will be apparent to skilled artisans upon reviewing the instant disclosure. Ion implantation is a known process step involving the introduction of accelerated ions into a material, such as conductive layer 120. This introduction is facilitated by using a relatively high-energy source—on the order of 10 to 100 kilo-electron volts ("keV"). The accelerated atoms penetrate the surface of conductive layer 120 at a depth determined by the atomic number and the energy of the accelerated atoms. In the instant method step, a number of accelerated atoms formed of the resistance-altering constituent penetrate the surface of conductive layer 120 at a appropriate depth to modify the resistance of each segment, 122 through 132. The degree in which the resistance of each segment, 122 through 132, is modified depends on the concentration (i.e., dosage) of accelerated atoms of the resistance-altering constituent implanted within each segment.

Conductive layer 120 may be selected from a number of materials, such as polycrystalline silicon, for example. The resistance-altering constituent may be selected from a number of materials for modifying the resistance of conductive layer 120. Advantageously, the resistance-altering constituent comprises at least one Group IA element, such as hydrogen, to ultimately (e.g., upon completion of the method detailed herein) reduce the resistance of conductive layer 120 when disposed therein. However, it will be apparent to skilled artisans from the instant disclosure that, if desired, various resistance-altering constituents may be used to ultimately increase (as opposed to decrease) the resistance of conductive layer 120.

Referring to FIG. 4(b), a perspective view is illustrated of a second process step according to the present method. Here, at least a portion of the resistance-altering constituent atoms disposed within conductive layer 120 is selectively moved according to a desired pattern. More particularly, each of the segments—having similar concentrations of resistance-altering constituent atoms disposed therein—is individually annealed (e.g., heated or cured). By performing the step of annealing, a portion of the resistance-altering constituent atoms disposed within each segment, 122 through 132, may be moved from their initial implant location. In another example, the step of annealing causes the portion of the resistance-altering constituent atoms disposed within each segment, 122 through 132, to diffuse out. For the purposes of the present disclosure, out-diffuse means at least one of the following: (a) diffusing out of the portion of the resistance-altering constituent atoms from each segment, 122 through 132, of conductive layer 120; (b) moving or repositioning the portion of the resistance-altering constituent atoms to other locations, including grain boundaries, of conductive layer 120; or (c) changing the resistance-altering constituent atoms from an initial implanted location to a lower energy configuration. The out-diffusion of the resistance-altering constituent atoms from each segment, 122 through 132, may be controlled by the temperature and exposure time of the anneal step.

The step of annealing may be realized by various known techniques. One such method involves employing a light source 136 having a lens element 138 for annealing each implanted segment. Light source 136 may have a control mechanism for modifying both the intensity (e.g., heat) and exposure time—thereby controlling the anneal step, as applied to each segment of conductive layer 120. It will be apparent to skilled artisans that other arrangements and components may also employed to modify the parameters (i.e., temperature and exposure time) of the anneal step, as applied to segments, 122 through 132. To insure each segment, 122 through 132, may be annealed, light source 136 is moveable along a track, for example. It should be noted that the parameters of the anneal step may be varied as light source 136 moves along its track such that each segment is annealed at a distinct temperature for a distinct time period. By varying the annealing parameters, the resistance of each segment, 122 through 132 may be patterned.

Referring to FIG. 4(c), a perspective view is illustrated of the results of the present method. Prior to annealing conductive layer 120, the resistance of each segment, 122 through 132, is modified by disposing a concentration of resistance-altering constituent atoms therein. For the purposes of illustration, each segment, prior to annealing, has the same concentration of resistance-altering constituent atoms disposed therein. Consequently, upon completing the step of in-diffusion, each segment, 122 through 132, has about the same resistance. It should be noted that current may flow through each resultant segment in any intended direction.

Once the step of annealing is performed, however, the resistance of each segment, 122 through 132, is changed. More particularly, the application of heat over a period of time causes the out-diffusion of resistance-altering constituent atoms from each segment. This out-diffusion changes the concentration of resistance-altering constituent atoms disposed within each segment, 122 through 132. A change in the concentration of resistance-altering constituent atoms within each segment, 122 through 132, results in a change in the resistance of each segment.

Since each segment, 122 through 132, may be annealed at a distinct temperature for a distinct time period, the resistance of the segments may be varied with respect to one another. The variation in the resistance of each segment, 122 through 132, may be achieved by modifying the parameters of the anneal step. Consequently, the resistance of conductive layer 120 may be patterned by modifying the parameters of the anneal step from one segment to another segment.

As shown in FIG. 4(c), the resistances of conductive layer 120 are patterned such that three pairs of resistances are formed according to the hereinabove method. A first temperature and exposure time results in segments 122 and 128 having about the same concentrations of the resistance-altering constituent atoms disposed therein, and, thusly, a first resistance. Similarly, a second temperature and exposure time results in segments 124 and 130 having a second resistance, while a third temperature and exposure time results in segments 126 and 132 having a third resistance. It will be apparent to skilled artisans, however, that various other patterns may be employed using the present method.

Referring to FIGS. 5(a) through 5(e), cross-sectional views of an example of the method of achieving a varying resistance along a conductive layer are shown. More particularly, the cross-sectional views depict a method of making a binary-based ROM 150, which incorporates a number of steps from the method detailed hereinabove and illustrated in FIGS. 4(a) through 4(c). It will be apparent to skilled artisans upon reviewing the instant disclosure that these incorporated method steps may be employed in "writing" (i.e., programming) bits of data into the memory cells of binary-based ROM 150 of FIG. 5(e).

Figure 5A:
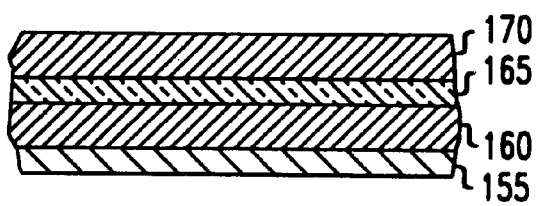
FIGS. 5(a) through 5(e) are cross-sectional views of an example of the method of FIGS. 4(a) through 4(c).

Referring to FIG. 5(a), a stack of layers employed in forming ROM 150 is shown. The stack of layers comprises a substrate 155, which may be realized by various materials, including a silicon, for example. Formed on substrate 155 is a first insulating layer 160. First insulating layer 160 insulates substrate 155 from a conductive layer 165. First insulating layer 160 may comprise various dielectric materials, including, for example, silicon dioxide, while conductive layer 165 may be realized by various conductive materials, such as metal nitride or silicide, for example.

Dielectric layer 160 insulates substrate 155 from a planar array of word lines. Each word line is formed from conductive layer 165 using one of a number of techniques known to skilled artisans. In one approach, conductive layer 165 is initially formed on dielectric layer 160 by a deposition step. Thereafter, portions of conductive layer 165 are removed by means of a lithographic mask and an etching step, for example, to form the planar array of word lines.

Once the planar array of word lines is created from conductive layer 165, a second insulating layer 170 is formed thereon. Second insulating layer 170 insulates subsequently formed memory cells from one another. Second insulating layer 170 may be formed by various methods known to skilled artisans, including a deposition step. Second insulating layer 170 may comprise various dielectric materials, including silicon dioxide, for example.

Figure 5B:
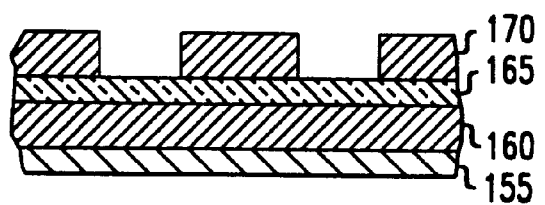

Referring to FIG. 5(b), a process step is performed on the stack of layers shown in FIG. 5(a). More particularly, portions of second insulating layer 170 are removed to create a via or hole supporting each subsequently formed memory cell. While various techniques are known to skilled artisans for insulating each of the memory cells from one another, one method removes portions of second insulating layer 170 by means of a lithographic mask and an etching step to create the desired holes.

Figure 5C:
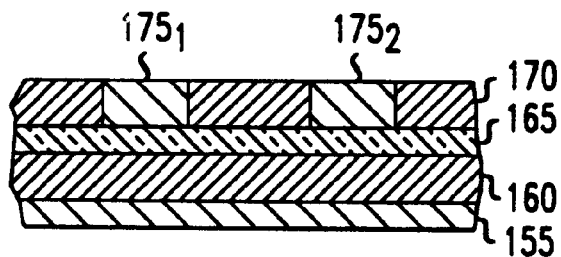

Referring to FIG. 5(c), a process step is performed on the stack of layers shown in FIG. 5(b). Here, each hole in second insulating layer 170 is filled with a conductive material for subsequently formed memory cells, $175_1$ and $175_2$. The conductive material may be selected from a number of materials, including polycrystalline silicon, for example. Considerations in selecting the conductive material include its resistivity—relative to the resistivity of the subsequently formed bit lines—to minimize crosstalk.

Figure 5D:
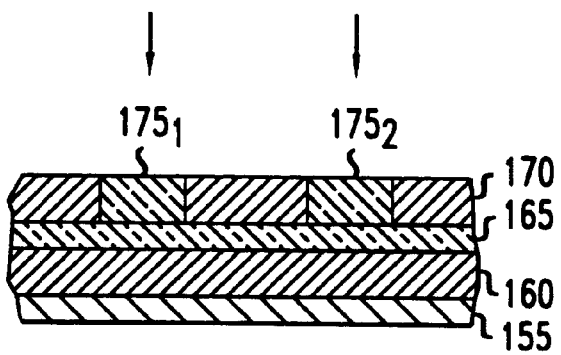

Referring to FIG. 5(d), a process step is performed on the structure of FIG. 5(c). More particularly, this process step is derived from the method of varying the resistance of a conductive layer, detailed hereinabove and illustrated in FIGS. 4(a) through 4(c). This process step completes the formation of a number of unwritten (i.e., not yet programmed) memory cells, $175_1$ and $175_2$ of binary-based ROM 150.

As shown, this process step diffuses a resistance-altering constituent into each unwritten memory cell, $175_1$ and $175_2$. This process step may be realized by various techniques known in the art, including ion implantation. For example, the lithographic mask employed in forming the holes within second dielectric layer 170 may be similarly used to limit the implantation of the resistance-altering constituent to unwritten memory cells, $175_1$ and $175_2$. Any resistance-altering constituent incidentally implanted within second dielectric layer 170, however, will minimally impact the dielectric properties of second dielectric layer 170.

Figure 5E:
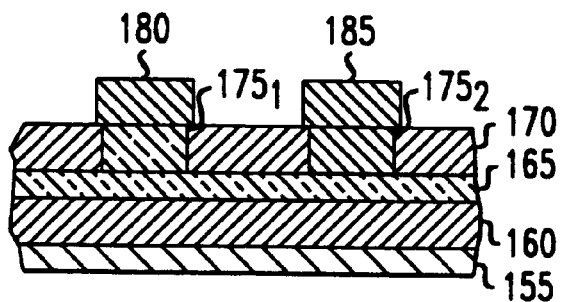

Referring to FIG. 5(e), a process step is performed on the structure of FIG. 5(d). This process step is also derived from the method detailed hereinabove and illustrated in FIGS. 4(a) through 4(c). More particularly, this process step involves varying the resistance of the conductive layer in each memory cell, $175_1$ and $175_2$, according to a designated pattern. Consequently, a method is disclosed for "writing" bits of data into memory cells, $175_1$ and $175_2$.

To facilitate the "writing" of data bits into memory cells, $175_1$ and $175_2$, a planar array of bit lines 180 and 185 may be initially formed. It will be apparent to skilled artisans, however, that the planar array of bit lines 180 and 185 may be formed prior to the in-diffusion step of FIG. 5(d) by modifying various parameters and conditions. Moreover, it should be noted that bits of data may be written into memory cells, $175_1$ and $175_2$, prior to forming bit lines, 180 and 185. Bit lines, 180 and 185, are formed from a conductive material using one of a number of techniques known to skilled artisans. In one approach, a layer of conductive material is formed on dielectric layer 170, as well as memory cells, $175_1$ and $175_2$, by a deposition step. Thereafter, portions of this conductive layer are removed using a lithographic mask and an etching step to form the planar array of bit lines. The conductive layer may comprise various materials, including a metal nitride or silicide, for example. However, considerations in choosing the material for this conductive layer include the resultant wire resistance, $r_w$, of bit lines, 180 and 185, relative to the potential resistances of memory cells, $175_1$ and $175_2$, to minimize crosstalk.

Upon performing the in-diffusion step and forming the plurality of lines, 180 and 185, bits of data are "written" (i.e., programmed) into memory cells, $175_1$ and $175_2$. As the resistance-altering constituent is disposed within memory cells, $175_1$ and $175_2$, the data bits may be written by selectively removing at least a portion of the resistance-altering constituent from each designated memory cell through out-diffusion. The out-diffusion of the resistance-altering constituent from each designated memory cell modifies the resistance of each designated cell. Considerations in determining the portion of the resistance-altering constituent removed from each designated memory cell include the resultant resistance of each designated cell, relative to the wire resistance, $r_w$, of bit lines, 180 and 185.

The resistance-altering constituent may be selectively removed through out-diffusion using a localized annealing step. Alternatively, the resistance-altering constituent may be selectively removed by employing a local heating step to designated memory cells before or after the formation of bit lines, 180 and 185. Localized annealing may be achieved by various steps including, for example, applying a "write" voltage to each designated cell—the "write" voltage being substantially higher (e.g., at least 10V) than the "read" voltage. Applying the write voltage causes the resistance-altering constituent to diffuse out from conductive material of each designated memory cell. The write voltage is applied to each designated memory cell through the formed word lines and selected bit lines. More particularly, the bit lines associated with each designated memory cell are grounded—while the bit lines associated with each non-designated memory cell are left as an open circuit—such that the write voltage is applied from each successive word line to enable the localized annealing step. Alternatively, the resistance-altering constituent may be selectively removed by employing a heat step before or after the formation of bit lines, 180 and 185.

Consequently, the resistance-altering constituent determines the binary value written and stored therein. In the illustrated example, a first binary value is stored in first memory cell, $175_1$, by having the resistance-altering constituent disposed within the polycrystalline silicon of that cell. Furthermore, a second binary value is stored in second memory cell, $175_2$, by not having the resistance-altering constituent disposed within the polycrystalline silicon of that cell. It will be apparent to skilled artisans that the second binary value may also be stored in second memory cell, $175_2$, by having a different amount of the resistance-altering constituent disposed within the polycrystalline silicon of cell, $175_2$, relative to the polycrystalline silicon of cell, $175_1$.

In contrast with ROM structure 10 of FIG. 1, each designated memory cell, as well as each non-designated memory cell of ROM 150 comprise a sufficiently high resistance relative to the wire resistance, $r_w$, of bit lines, 180 and 185. As such, the potential for crosstalk is minimized. Moreover, each memory cell of the plurality in ROM 150 comprises a reduced unit area, in comparison with ROM structure 30 of FIG. 2, to provide the potential for increased storage density.

While the particular invention has been described with reference to illustrative embodiments, this description is not meant to be construed in a limiting sense. It is understood that although the present invention has been described, various modifications of the illustrative embodiments, as well as additional embodiments of the invention, will be apparent to one of ordinary skill in the art upon reference to this description without departing from the spirit of the invention, as recited in the claims appended hereto. It is therefore contemplated that the appended claims will cover any such modifications or embodiments as fall within the true scope of the invention.

What is claimed is:

1. A method comprising:
   moving at least a portion of a resistance-altering constituent diffused within a conductive layer, the resistance-altering constituent comprising at least one Group IA element, the resistance-altering constituent moved such that the resistance varies along the conductive layer.

2. The method of claim 1, wherein the step of moving at least a portion of a resistance-altering constituent comprises annealing the conductive layer.

3. The method of claim 2, wherein the step of annealing the conductive layer comprises the step of removing the at least a portion of a resistance-altering constituent.

4. The method of claim 2, wherein the step of annealing the conductive layer comprises:
   annealing at least a first segment of the conductive layer according to a first set of parameters; and annealing at least a second segment of the conductive layer according to a second set of parameters.

5. The method of claim 3, wherein each step of annealing comprises applying electromagnetic energy.

6. The method of claim 5, wherein the electromagnetic energy comprises light, each set of parameters comprises an intensity and an exposure time, and at least one parameter of each set varies.

7. The method of claim 4, wherein each step of annealing comprises applying a voltage.

8. The method of claim 7, wherein each set of parameters comprises a voltage and a time, and at least one parameter of each set varies.

9. The method of claim 1, wherein the conductive layer comprises polycrystalline silicon.

10. A method comprising:

diffusing a resistance-altering constituent into a conductive layer, the resistance-altering constituent comprising at least one Group IA element; and forming a resistance that varies along the conductive layer by moving at least a portion of the resistance-altering constituent from the conductive layer.

11. The method of claim 10, wherein the step of forming a varying resistance comprises annealing the conductive layer.

12. The method of claim 11, wherein the step of annealing the conductive layer comprises the step of removing the at least a portion of a resistance-altering constituent.

13. The method of claim 12, wherein the step of annealing the conductive layer comprises:

annealing at least a first segment of the conductive layer according to a first set of parameters; and annealing at least a second segment of the conductive layer according to a second set of parameters.

14. The method of claim 13, wherein each step of annealing comprises applying electromagnetic energy.

15. The method of claim 14, wherein the electromagnetic energy comprises light, each set of parameters comprises an intensity and an exposure time, and at least one parameter of each set varies.

16. The method of claim 13, wherein each step of annealing comprises applying a voltage.

17. The method of claim 15, wherein each set of parameters comprises a voltage and an application time, and at least one parameter of each set varies.

18. The method of claim 10, wherein the conductive layer comprises polycrystalline silicon.

* * * * *